(12) United States Patent
Bando

(10) Patent No.: US 7,782,124 B2
(45) Date of Patent: Aug. 24, 2010

(54) VOLTAGE SUPPLY CIRCUIT OF SEMICONDUCTOR DEVICE

(75) Inventor: Yoshihide Bando, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/025,047

(22) Filed: Dec. 30, 2004

(65) Prior Publication Data

US 2006/0049860 A1    Mar. 9, 2006

(30) Foreign Application Priority Data

Sep. 3, 2004    (JP) .............................. 2004-257644

(51) Int. Cl.
*G05F 3/02* (2006.01)
(52) U.S. Cl. ....................... 327/544; 327/538
(58) Field of Classification Search ................. 327/544
See application file for complete search history.

(56) References Cited

U.S. PATENT DOCUMENTS

| | | | | |
|---|---|---|---|---|
| 4,039,869 A * | 8/1977 | Goldman et al. | ............ | 327/566 |
| 5,376,837 A * | 12/1994 | Nakano | ....................... | 327/530 |
| 5,389,842 A * | 2/1995 | Hardee | ....................... | 327/391 |
| 5,815,013 A * | 9/1998 | Johnston | ..................... | 327/112 |
| 6,380,769 B1 * | 4/2002 | Hall et al. | ................... | 327/112 |
| 6,487,133 B2 * | 11/2002 | Wada et al. | ................. | 365/205 |
| 6,714,050 B2 * | 3/2004 | McClintock et al. | .......... | 326/83 |
| 6,756,839 B2 * | 6/2004 | Hall et al. | ................... | 327/538 |
| 6,836,151 B1 * | 12/2004 | McClintock et al. | .......... | 326/83 |
| 6,864,708 B2 | 3/2005 | Takahashi et al. | | |
| 6,930,517 B2 * | 8/2005 | Hall | ........................... | 327/108 |
| 7,019,418 B2 * | 3/2006 | Kakiuchi | ..................... | 307/126 |
| 2002/0186072 A1 * | 12/2002 | Mano et al. | ................. | 327/538 |
| 2003/0122595 A1 * | 7/2003 | Hall et al. | ................... | 327/112 |
| 2004/0095182 A1 * | 5/2004 | Tomari et al. | ............... | 327/417 |
| 2004/0100303 A1 * | 5/2004 | Congdon | ..................... | 326/81 |
| 2005/0151579 A1 * | 7/2005 | Kakiuchi | ..................... | 327/534 |

FOREIGN PATENT DOCUMENTS

| | | |
|---|---|---|
| JP | 2002-158576 | 5/2002 |
| JP | 2002-314393 | 10/2002 |
| JP | 2003-037494 A | 2/2003 |
| JP | 2003-068079 | 3/2003 |
| JP | 2003-198354 | 7/2003 |

* cited by examiner

*Primary Examiner*—Lincoln Donovan
*Assistant Examiner*—Ryan C Jager
(74) *Attorney, Agent, or Firm*—Arent Fox LLP

(57) ABSTRACT

The purpose of the present invention is to decrease a leak current of a voltage supply circuit using a MOS transistor. This voltage supply circuit comprises an n-channel MOS transistor having a low threshold voltage, the drain of which is connected to the power supply voltage, and a p-channel MOS transistor, the source of which is connected to the source of the n-channel MOS transistor and which supplies a voltage vii from the drain to a load circuit. Since a voltage V gs=1 V is applied to the gate-sources of the p-channel MOS transistor when said circuit is on standby, the p-channel MOS transistor operates in a larger cut-off region than an ordinary cut-off region.

10 Claims, 6 Drawing Sheets

– PRIOR ART –
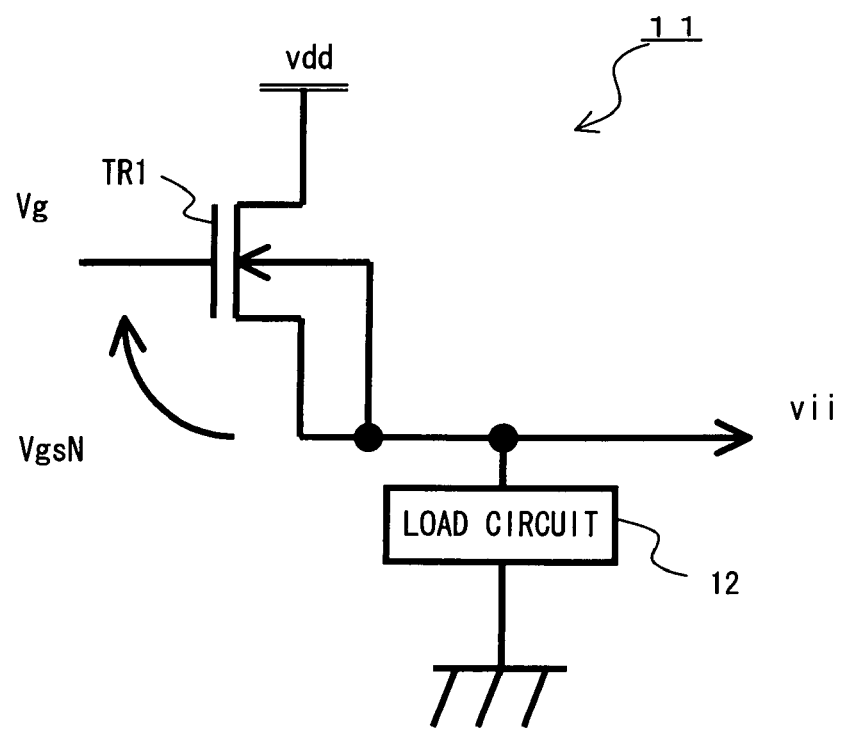
F I G. 1

– PRIOR ART –
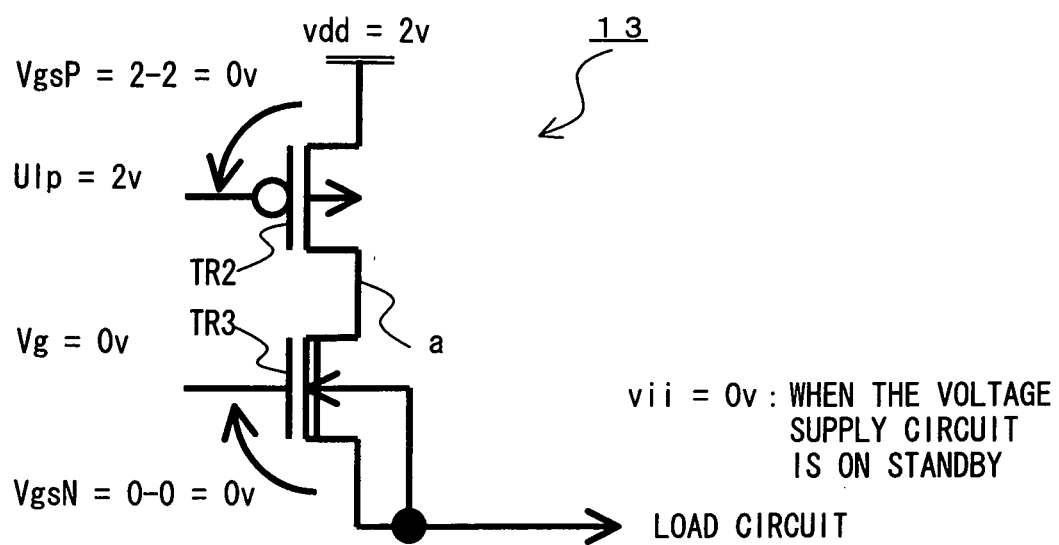
F I G. 2

– PRIOR ART –

– PRIOR ART –

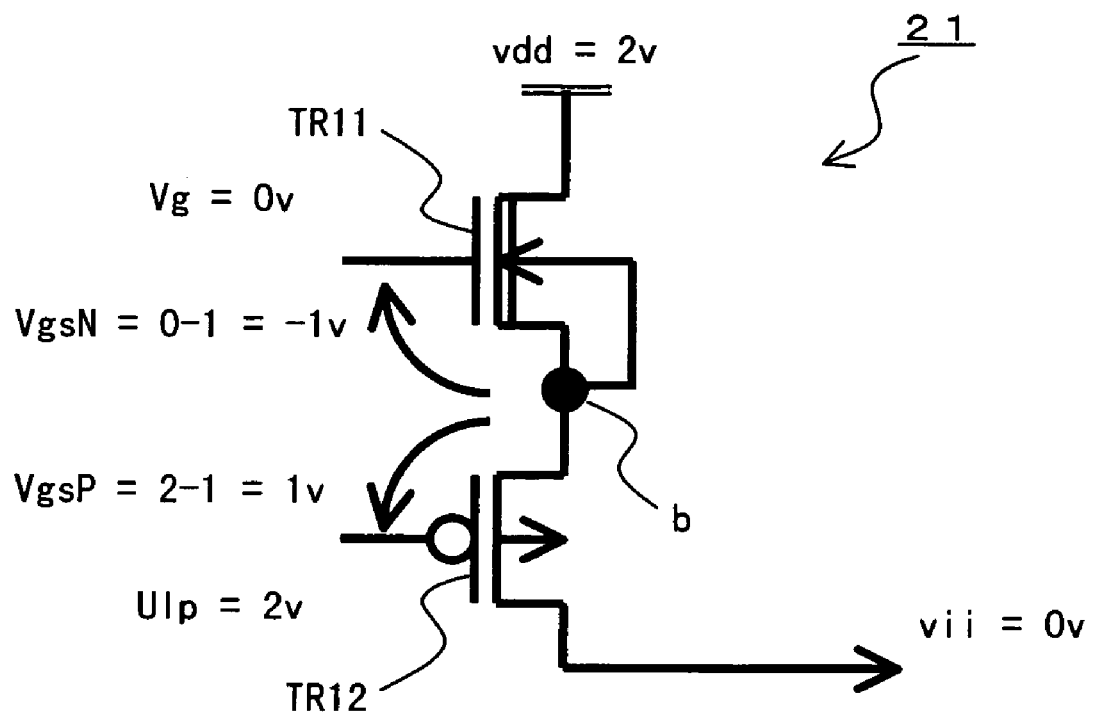
F I G. 6

VOLTAGE SUPPLY CIRCUIT OF SEMICONDUCTOR DEVICE

CROSS-REFERENCE TO RELATED APPLICATIONS

This application is based upon and claiming the benefit of priority from the prior Japanese Patent Application No. 2004-257644, filed in Sep. 3, 2004, the entire contents of which are incorporated herein by reference.

BACKGROUND OF THE INVENTION

1. Field of the Invention

The present invention relates to a voltage supply circuit which supplies a voltage to a load circuit in a semiconductor device.

2. Description of the Related Art

In a semiconductor device, a voltage supply circuit which can supply a large enough current when said circuit operates normally and which has little leak current at a standby time when the internal circuit stops its operation is desired.

FIG. 1 is a circuit diagram of a voltage supply circuit 11 of a conventional semiconductor device. The voltage supply circuit 11 shown in FIG. 1 connects the drain of an n-channel MOS transistor TR1 to a power supply voltage vdd, and the source to a load circuit 12.

The voltage supply circuit 11 can control the voltage Vii supplied to the load circuit 12 when said circuit operates normally by controlling the gate voltage of the n-channel MOS transistor TR1. The voltage supply circuit shown in FIG. 1 turns off the MOS transistor TR1 when said circuit is on standby by making the gate voltage Vg grounding potential, and intercepts the leak current from the power supply voltage vdd.

The development of a low-voltage semiconductor device has advanced in recent years, and it is getting difficult to realize a low-voltage supply circuit by a MOS transistor whose threshold voltage is an ordinary voltage such as 0.6 V or so.

Then, it is considered to configure a voltage supply circuit using a MOS transistor whose threshold voltage is lower than that of an ordinary MOS transistor.

FIG. 2 shows an example of the voltage supply circuit using an N-channel MOS transistor TR3 having a low threshold voltage. The two vertical lines between the drain and source of the MOS transistor TR3 shown in FIG. 2 indicate that the MOS transistor TR3 is a MOS transistor having a low threshold voltage.

FIG. 3 shows the characteristics of the drain voltage versus the voltage V between the gate and source of an enhancement type of n-channel MOS transistor.

In the enhancement type of MOS transistor, when, for example, the current I ds flowing between the drain and the source is 1 μA, the voltage between the gate and source is defined as a threshold voltage V th, as shown in FIG. 3. As is apparent from FIG. 3, a current flows between the drain and source of the n-channel MOS transistor even when the voltage V gs between the gate and the source is equivalent to or less than the threshold voltage V th.

The n-channel MOS transistor having a low threshold voltage has characteristics that a leak current increases as compared with a n-channel MOS transistor having an ordinary threshold voltage. Therefore, in the voltage supply circuit 13 shown in FIG. 2, the leak current is limited by connecting a p-channel MOS transistor TR2 on the power supply side and turning off the p-channel MOS transistor TR2 when the voltage supply circuit is on standby.

Described below is the operation of the voltage supply circuit shown in FIG. 2 when said circuit is on standby. To make understanding easy, an example when the power supply voltage vdd is 2 V is taken. In this case, 2 V is applied to the p-channel MOS transistor TR2 as a gate voltage U 1p when the voltage supply circuit is on standby, and 0 V is applied to the N-channel MOS transistor TR3 as a gate voltage Vg.

If it is supposed that the characteristics of the p-channel MOS transistor TR2 and the n-channel MOS transistor TR3 are the same, and the resistance values when these two transistors are turned off are almost the same, the potential at the connecting point a of the p-channel MOS transistor TR2 and the n-channel MOS transistor TR3 is ½ of the power supply voltage vdd (=2 V), i.e. 1 V.

Consequently, the voltage V gs between the gate and source of the p-channel MOS transistor TR2 is 2-2=0 V, and the voltage V gs between the gate and source of the n-channel MOS transistor TR3 is 0-0=0 V.

In this case, the leak current flowing from the power supply voltage vdd to the load circuit via the MOS transistors TR2 and TR3 becomes equal to the leak current when the voltage V gs P=0 V between the gate and source of the p-channel MOS transistor TR2 having an ordinary threshold voltage, because the leak current of the MOS transistor TR2 having a low threshold voltage is larger.

In order to decrease the leak current of the voltage supply circuit, decreasing the leak current of the p-channel MOS transistor by providing the n-channel MOS transistor in the current path of the power supply standby circuit using the p-channel MOS transistor having a low threshold voltage and turning off the n-channel MOS transistor is described, for example, in patent document 1.

Described in patent document 2 is a circuit which realizes a high operation speed and low consumption power in a logic circuit using a CMOS circuit having a plurality of threshold voltages. Thus, it is described in the invention of patent document 2 that a MOS transistor having a high threshold voltage is connected between the CMOS logic circuit having a plurality threshold voltages and a power supply line, and between the CMOS logic circuit having a plurality threshold voltages and a grounding conductor, and when the circuit changes to a standby state, the MOS transistor having a high threshold voltage is turned off and a leak current is decreased.

However, the invention of patent document 1 or patent document 2 is intended to decrease a leak current by connecting a MOS transistor on the current path of a power supply line or a grounding conductor and a load circuit, and turning off the MOS transistor having a high threshold voltage, but is not intended to decrease the leak current itself of the MOS transistor.

Patent document: Kokai (Jpn. Unexamined patent publication) No. 2002-314393

Patent document: Kokai (Jpn. Unexamined patent publication) No. 2003-198354

SUMMARY OF THE INVENTION

The purpose of the present invention is to decrease a leak current of a voltage supply circuit using a MOS transistor when said circuit is on standby.

The semiconductor device of the present invention comprises a voltage supply circuit which comprises a n-channel MOS transistor, the drain of which is connected to a power supply, and a p-channel MOS transistor, the source of which is connected to the source of the n-channel MOS transistor, and the drain of which is connected to a load, and when said circuit is on standby, a voltage equivalent to or higher than a power supply voltage is applied to the gate of at least the p-channel MOS transistor, and a gate-source voltage of the p-channel MOS transistor which becomes a cut-off condition is realized on a cut-off condition having a higher voltage between the gate and source of the p-channel MOS transistor.

According to this invention, since the p-channel MOS transistor can be operated on a cut-off condition having a higher voltage than the gate-source voltage which becomes a cut-off condition when said circuit is on standby, a leak current of the voltage supply circuit can be decreased. For example, when a MOS transistor having a low threshold voltage is used, a voltage supply circuit which supplies a low power-supply voltage and has little leak current when said circuit is on standby can be realized.

Said voltage supply circuit may be made to apply a voltage equivalent to or higher than a power supply voltage to the gate of the p-channel MOS transistor, apply grounding potential or negative potential to the gate of the n-channel MOS transistor, and a gate-source voltage of the p-channel MOS transistor which becomes a cut-off condition is realized on the cut-off condition having a higher voltage between the gate and source of the p-channel MOS transistor and a gate-source voltage of the n-channel MOS transistor which becomes a cut-off condition is realized on the cut-off condition having a lower voltage between the gate and source of the n-channel MOS transistor, when said voltage supply circuit is on standby.

Such a configuration of the voltage supply circuit makes it possible to operate the p-channel MOS transistor and the n-channel MOS transistor on a cut-off condition having a voltage higher or lower than the voltage between the gate and source of the MOS transistors which becomes a cut-off condition, so that the leak current of the voltage supply circuit when said circuit is on standby can be decreased.

Said voltage supply circuit may be made to apply a voltage equivalent to or higher than a power supply voltage to the gate of the p-channel MOS transistor, apply grounding potential or negative potential to the gate of the n-channel MOS transistor, and make the absolute value of the difference in voltage between a gate-source voltage when the p-channel MOS transistor is turned on and a gate-source voltage when the p-channel MOS transistor is turned off become large, when said voltage supply circuit is on standby.

By configuring the voltage supply circuit in this way, the p-channel MOS transistor can be made to operate on a cut-off condition in which the gate-source voltage which becomes a cut-off condition is a higher voltage. Thus, the leak current of the voltage supply circuit when said circuit is on standby can be decreased.

Said voltage supply circuit, when being on standby, applies a voltage equivalent to or higher than a power supply voltage to the gate of the p-channel MOS transistor, applies grounding potential or negative potential to the gate of the n-channel MOS transistor, makes the absolute value of the difference in voltage between the gate-source voltage when the n-channel MOS transistor is turned on and the gate-source voltage when the n-channel MOS transistor is turned off become large, and realizes a gate-source voltage of the n-channel MOS transistor which becomes a cut-off condition on a cut-off condition having a lower voltage between the gate and source of the n-channel MOS transistor.

By configuring the voltage supply circuit in this way, the n-channel MOS transistor can be operated at a lower voltage than the gate-source voltage of the n-channel MOS transistor which becomes a cut-off condition when said circuit is on standby. Thus, the leak current of the voltage supply circuit when said circuit is on standby can be decreased.

When the potential of the connecting point of the n-channel MOS transistor and the p-channel MOS transistor is given as Vb, said voltage supply circuit may apply a power supply voltage to the gate of the p-channel MOS transistor, and the gate-source voltage of the p-channel MOS transistor may be made to be a difference in voltage between the power supply voltage and the voltage Vb.

When the potential of the connecting point of the n-channel MOS transistor and the p-channel MOS transistor is given as Vb, said voltage supply circuit may apply grounding potential to the gate of the n-channel MOS transistor, and the gate-source voltage of the n-channel MOS transistor may be made to be a voltage lower by voltage Vb than 0 V.

The W/L ratio of the channel width W to the channel length L of the p-channel MOS transistor of the voltage supply circuit may be set to such a value that compensates for a voltage drop due to the n-channel MOS transistor.

By configuring the voltage supply circuit in this way, a voltage drop due to the n-channel MOS transistor can be decreased.

BRIEF DESCRIPTION OF THE DRAWINGS

FIG. 1 is a circuit diagram showing a conventional voltage supply circuit.

FIG. 2 is a circuit diagram showing another conventional voltage supply circuit.

FIG. 4 shows the operation of a conventional voltage circuit when said circuit is turned on.

FIG. 6 shows the operation of the voltage supply circuit in the embodiment of the present invention when said circuit is on standby.

DESCRIPTION OF THE PREFERRED EMBODIMENTS

Figure 5:
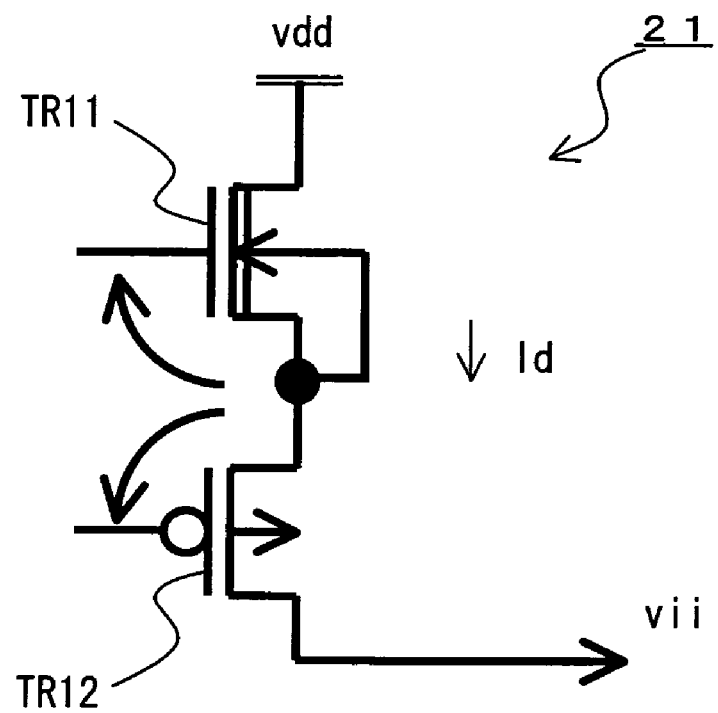
FIG. 5 is a circuit diagram showing the voltage supply circuit in the embodiment of the present invention.

Described below is the embodiment of the present invention with reference to the drawings. FIG. 5 is a circuit diagram showing a voltage supply circuit 21 in the embodiment of the present invention.

This voltage supply circuit 21 comprises a n-channel MOS transistor TR 11 having a low threshold voltage, the drain of which is connected to the power supply voltage vdd, and a p-channel MOS transistor TR 12, the source of which is connected to the source of the n-channel MOS transistor and which supplies a voltage vii from the drain to a load circuit. The p-channel MOS transistor TR 12 is a transistor of an ordinary threshold voltage.

Described here is an example of the operation of the voltage supply circuit 21, when being on standby, whose output voltage vii becomes 0 V at 2V of the power supply voltage, with reference to FIG. 6.

The potential (Vb) of the connecting point b of the n-channel MOS transistor TR 11 and the p-channel MOS transistor TR 12 when the p-channel MOS transistor TR 11 and the n-channel MOS transistor TR 12 are turned off becomes about 1 V, if the resistance value of both transistors when both transistors are turned off is almost equal.

When the voltage supply circuit 21 is on standby, a voltage of grounding potential vss (=0 V) level is applied as the gate voltage Vg to the gate of the n-channel MOS transistor TR 11 on the side of the power supply.

Consequently, the gate-source voltage V gs N off of the n-channel MOS transistor TR 11 at that time is V gs N off=vss−Vb=0−1=−1 V.

When the n-channel MOS transistor TR 11 is turned on, a voltage equivalent to or higher than the power supply voltage vdd is applied to the gate of the n-channel MOS transistor.

The gate-source voltage V gs N on of the n-channel MOS transistor when said transistor is turned on is V gs N on=vdd−0=2.0−0=2.0 V.

Consequently, the difference in voltage between the gate-source voltage V gs N on when the n-channel MOS transistor TR 11 of the circuit shown in FIG. 6 is turned on and the gate-source voltage V gs N on when the n-channel MOS transistor TR 11 of the circuit shown in FIG. 6 is turned off is 2.0−(−1)=3.0 V.

When the n-channel MOS transistor is operated in a conventional circuit by a conventional cut-off voltage, the gate-source voltage V gs N on when the n-channel MOS transistor TR 11 of the circuit shown in FIG. 2 is turned on is 2.0 V, and the gate-source voltage V gs N off when the n-channel MOS transistor TR 11 of the circuit shown in FIG. 2 is turned off is 0 V.

Consequently, the difference in voltage of the gate -source voltage between when the n-channel MOS transistor of the circuit shown in FIG. 2 is turned on and when the n-channel MOS transistor of the circuit shown in FIG. 2 is turned off is 2.0 V.

Since a reverse bias voltage (−1 V) larger than before is given to the gate of the n-channel MOS transistor by using the circuit shown in FIG. 6 when the n-channel MOS transistor is turned off, the n-channel MOS transistor TR 11 operates on a cut-off condition having a lower voltage than the gate-source voltage of the n-channel MOS transistor which becomes a cut-off condition.

This is because the difference in voltage of the gate-source voltage V gs N of the n-channel MOS transistor shown in FIG. 6 between when said transistor is turned on and when said transistor is turned off is larger in the absolute value than the difference in voltage of the n-channel MOS transistor shown in FIG. 2 between when said transistor is turned on and when said transistor is turned off, and a larger reverse bias voltage is given between the gate and source of the n-channel MOS transistor TR 11.

Thus, the current flowing between the drain and source of the n-channel MOS transistor TR 11 when said transistor is turned off is less than when said transistor operates on a cut-off condition of a conventional circuit method.

The same holds true in the p-channel MOS transistor TR 12. Since a power supply voltage vdd is applied to the gate when said transistor is turned off, the gate -source voltage V gs P off when said transistor is turned off is V gs P off=vdd=Vb=2−1=1 V.

When the p-channel MOS transistor TR 12 is turned on, grounding potential is applied to the gate of the p-channel MOS transistor TR 11.

The gate-source voltage V gs P on of the p-channel MOS transistor TR 12 when said transistor is turned on is V gs P on=0−vdd=0−2−−2 V.

Therefore, the difference in voltage between the gate-source voltage V gs P on of the p-channel MOS transistor TR 12 shown in FIG. 6 when said transistor is turned on and the gate-source voltage V gs P off of the p-channel MOS transistor TR 12 when said transistor is turned off is −2−1=−3 V.

The gate-source voltage V gs P on of the p-channel MOS transistor when said transistor is turned on and is operated normally on the circuit shown in FIG. 2 is −2 V, and the gate-source voltage V gs P off of the p-channel MOS transistor when said transistor is turned off is 0 V.

Therefore, the difference in voltage of the gate -source voltage of the p-channel MOS transistor on the circuit shown in FIG. 2 when said transistor is turned on and when said transistor is turned off is −2 V.

Since a larger reverse bias voltage (about 1 V) than usual is given to the gate of the p-channel MOS transistor TR 12 when said transistor is turned off by using the circuit shown in FIG. 6, the p-channel MOS transistor TR 12 operates at a voltage higher than an ordinary cut-off condition.

This is because by using the circuit shown in FIG. 6, the difference in voltage of the gate-source voltage of the p-channel MOS transistor between when said transistor is turned on and when said transistor is turned off becomes larger in the absolute value the difference in voltage of the p-channel MOS transistor which is operating normally between when said transistor is turned on and when said transistor is turned off, and a larger reverse bias voltage is given between the gate and source of the p-channel MOS transistor TR 12.

Thus, the current flowing between the drain and source of the p-channel MOS transistor TR 12 when said transistor is turned off is less than when said transistor operates on a cut-off condition of a conventional circuit method.

Therefore, by using the voltage supply circuit 21 of the configuration as described above, the leak current flowing from the power supply voltage vdd to the load circuit when said circuit is on standby can be decreased.

Here, the operation of a conventional voltage supply circuit 13 and the operation of the voltage supply circuit 21 in the embodiment when said circuits are turned on are explained.

First, described below is the operation of a conventional voltage supply circuit 13 when said circuit is turned on with reference to FIG. 4. When the transistor of the voltage supply circuit 13 is turned on and a voltage is supplied to a load circuit, it is necessary to apply grounding potential 0 V to the gate of the p-channel MOS transistor TR 2 connected on the power supply side, and apply the power supply voltage vdd=2.0 V to the gate of the n-channel MOS transistor TR 3 with a low threshold voltage on the load side.

The gate-source voltage V gs P on of the p-channel MOS transistor TR 2 when said transistor is turned on is V gs P on=0−2=−2 V. When the voltage supplied from the n-channel MOS transistor TR 3 to the load is given as vii, the gate-source voltage V gs N of the n-channel MOS transistor TR 3 is 2.0 V−vii.

Figure 3:
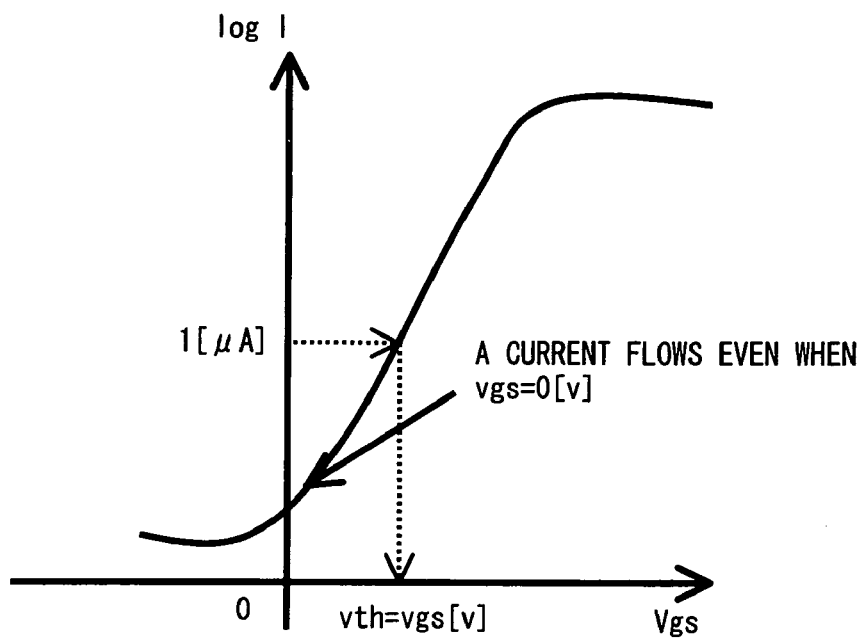
FIG. 3 shows the characteristics of a MOS transistor.
Figure 4:
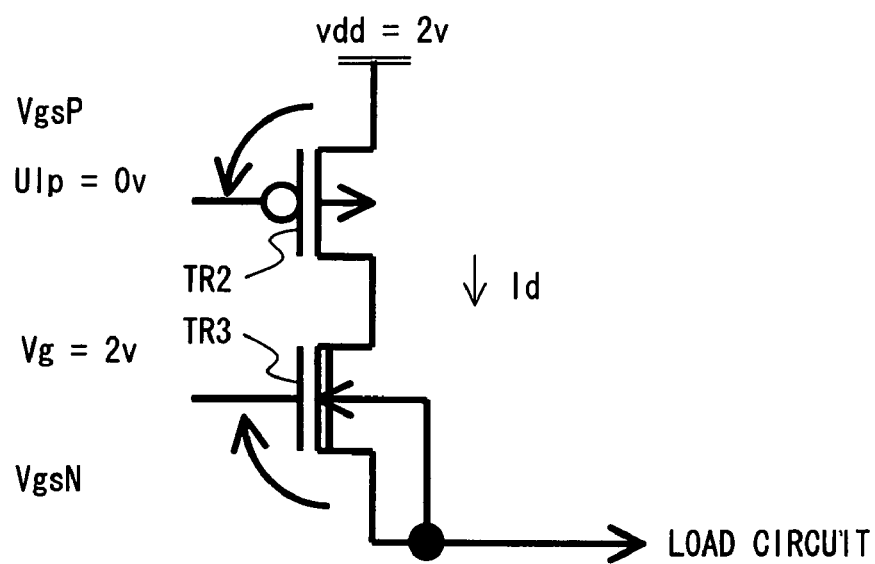

The gate voltage applied to the circuit shown in FIG. 5 and FIG. 6 when said circuit is turned on is the same as that of the circuit shown in FIG. 4. The power supply voltage vdd=2 V is applied to the gate of the n-channel MOS transistor TR 11 with a low threshold voltage on the power supply side, and grounding potential is applied to the gate of the p-channel MOS transistor TR 12 on the load side.

Here, the operation of the voltage supply circuit 21 in the embodiment and the operation of the conventional voltage supply circuit 13 are compared. Since the conventional voltage supply circuit 13 shown in FIG. 4 connects the p-channel MOS transistor TR 2 on the power supply side, the gate-source voltage V gs P on of the p-channel MOS transistor TR 2 when said transistor is turned on is 0−2=−2 V.

On the contrary, like the voltage supply circuit 21 shown in FIG. 5 and FIG. 6, when the n-channel MOS transistor TR 11 with a low threshold voltage is connected on the power supply side, and the source of the p-channel MOS transistor TR 12 is connected to the source of the n-channel MOS transistor TR 11, the voltage Vb of the connecting point b becomes lower by the threshold voltage of the n-channel MOS transistor TR 11.

As a result, the absolute value of the voltage V gs P on given between the gate and source of the p-channel MOS transistor TR 12 becomes small, and the source current becomes small. As a result, the output voltage of the p-channel MOS transistor TR 12 becomes lower. (A minus point appears in this part.)

For these reasons, in the design of the voltage supply circuit of a conventional semiconductor device, a circuit in which the p-channel MOS transistor TR 12 is arranged on the load side was employed as shown in FIG. 4.

In the present invention, by arranging the n-channel MOS transistor TR 11 with a low threshold voltage on the power supply side and arranging the p-channel MOS transistor TR 12 on the load side, the p-channel MOS transistor TR 12 and the n-channel MOS transistor TR 11 are made to operate on a cut-off condition with a higher voltage or a lower voltage than the gate ·source voltage of the p-channel MOS transistor and the n-channel MOS transistor which becomes the cut-off condition. Thus, it is possible to realize a voltage supply circuit which can be used for a semiconductor device driven at a low voltage and which has little leak current.

The size of a semiconductor element which is determined by the ratio of the channel width W to the channel length of the p-channel MOS transistor TR 12 may be made larger so that the voltage drop due to the n-channel MOS transistor TR 11 when said transistor is turned on is compensated for.

In the above-described embodiment, grounding potential is applied to the gate of a MOS transistor, but when a positive power supply voltage and a negative power supply voltage are used, a negative voltage may be made to be applied to the gate.

The present invention can be applied not only to a circuit using a MOS transistor having a low threshold voltage, but also to a voltage supply circuit using a MOS transistor having an ordinary threshold voltage.

According to the present invention, a p-channel MOS transistor can be made to operate on a cut-off condition with a higher voltage or a lower voltage than the gate-source voltage of the MOS transistor which becomes the cut-off condition when the voltage supply circuit is on standby, and the leak current of the voltage supply circuit can be decreased.

What is claimed is:

1. A semiconductor device, comprising:
a voltage supply circuit comprising:
an n-channel MOS transistor, the drain of which is connected to a power supply, the source of which is connected to a channel of the n-channel MOS transistor, wherein a voltage of the gate of the n-channel MOS transistor is controlled so that the n-channel MOS transistor is in an on-state during an operation and is in a cut-off condition in a standby; and
an p-channel MOS transistor, the source of which is connected to the source of the n-channel MOS transistor, and the drain of which is connected to a load, wherein when being on standby, for an output voltage supplied from the drain of the p-channel MOS transistor to the load to be a grounding potential, a voltage equivalent to or higher than a power supply voltage is applied to the gate of the p-channel MOS transistor so that a gate-source voltage of the p-channel MOS transistor, higher than the gate-source voltage of the p-channel MOS transistor between the gate and source under a cut-off condition of the p-channel MOS transistor, is applied between the gate and source of the p-channel MOS transistor,
wherein when a voltage is applied to the load, a grounding potential is supplied to the gate of the p-channel MOS transistor so as to set the p-channel MOS transistor to be in the on-state and a voltage equivalent to or higher than the power supply voltage is supplied to the gate of the n-channel MOS transistor so as to set the n-channel MOS transistor to be in the on-state,
wherein, when being on standby, the voltage equivalent to or higher than the power supply voltage is applied to the gate of the p-channel MOS transistor and the grounding potential or a negative potential is applied to the gate of the n-channel MOS transistor and the gate-source voltage of the p-channel MOS transistor, higher than the voltage between the gate and source of the p-channel MOS transistor under the cut-off condition, is applied so that the absolute value of the difference in voltage between the gate-source voltage of the p-channel MOS transistor when said transistor is turned on and the gate-source voltage of the p-channel MOS transistor when said transistor is turned off is larger than the absolute value of the difference in voltage between the gate-source voltage when said p-channel MOS transistor is turned on and the gate-source voltage when said p-channel MOS transistor is turned off based on a cut-off condition.

2. The semiconductor device according to claim 1, wherein when being on standby for the output voltage supplied from the drain of the p-channel MOS transistor to the load to be the grounding potential, the voltage equivalent to or higher than the power supply voltage is applied to the gate of the p-channel MOS transistor and the gate-source voltage of the p-channel MOS transistor higher than the gate-source voltage of the p-channel MOS transistor between the gate and source under the cut-off condition is applied between the gate and source of the p-channel MOS transistor, and the grounding potential or a negative potential is applied to the gate of the n-channel MOS transistor and a voltage lower than the voltage between the gate and source under the cut-off condition of the n-channel MOS transistor is applied between the gate and source of the n-channel MOS transistor.

3. The semiconductor device according to claim 2, wherein when the potential of a connecting point of the n-channel MOS transistor and the p-channel MOS transistor is given as Vb, the power supply voltage is applied to the gate of the p-channel MOS transistor when said circuit is on standby so that the gate-source voltage of the p-channel MOS transistor is made to be a difference in voltage between the power supply voltage and the voltage potential Vb.

4. The semiconductor device according to claim 2, wherein when the potential of a connecting point of the n-channel MOS transistor and the p-channel MOS transistor is given as Vb, the grounding potential is applied to the gate of the n-channel MOS transistor when said voltage supply circuit is on standby so that the gate-source voltage of the n-channel MOS transistor is made to be a voltage which is lower by Vb than 0 V.

5. The semiconductor device according to claim 2, wherein a W/L ratio of the channel width W to the channel length L of the p-channel MOS transistor of the voltage supply circuit is set to such a value that compensates for a voltage drop due to the n-channel MOS transistor.

6. The semiconductor device according to claim 1, wherein when being on the standby, a voltage difference smaller than the voltage difference between the gate and source under the cut-off condition is applied between the gate-source of the p-channel MOS transistor so that
the absolute value of the difference in voltage between the gate-source voltage of the p-channel MOS transistor when said transistor is turned on and the gate-source voltage of the p-channel MOS transistor when said transistor is turned off is larger than the absolute value of the difference in voltage between the gate-source voltage when said p-channel MOS transistor is turned on and the gate-source voltage when said p-channel MOS transistor is turned off based on a cut-off condition.

7. The semiconductor device according to claim 1, wherein when being on the standby, a voltage difference smaller than the voltage difference between the gate and source under the cut-off condition is applied between the gate and source of the p-channel MOS transistor so that the absolute value of the difference in voltage between the gate-source voltage of the n-channel MOS transistor when said transistor is turned on and the gate-source voltage of the p-channel MOS transistor when said transistor is turned off is larger than the absolute value of the difference in voltage between the gate-source voltage when said p-channel MOS transistor is turned on and the gate-source voltage when said p-channel MOS transistor is turned off based on a cut-off condition.

8. The semiconductor device according to claim 1, wherein when the potential of a connecting point of the n-channel MOS transistor and the p-channel MOS transistor is given as Vb, the power supply voltage is applied to the gate of the p-channel MOS transistor when said voltage supply circuit is on standby so that the gate-source voltage of the p-channel MOS transistor is made to be a difference in voltage between the power supply voltage and the voltage potential Vb.

9. The semiconductor device according to claim 1, wherein when the potential of a connecting point of the n-channel MOS transistor and the p-channel MOS transistor is given as Vb, the grounding potential is applied to a gate of the n-channel MOS transistor when said circuit is on standby so that the gate-source voltage of the n-channel MOS transistor is made to be a voltage which is lower by Vb than 0 V.

10. The semiconductor device according to claim 1, wherein a W/L ratio of the channel width W to the channel length L of the p-channel MOS transistor of the voltage supply circuit is set to such a value that compensates for a voltage drop due to the n-channel MOS transistor.

\* \* \* \* \*